United States Patent
Kamogawa et al.

(10) Patent No.: US 6,384,785 B1
(45) Date of Patent: May 7, 2002

(54) HETEROGENEOUS MULTI-LAMINATION MICROSTRIP ANTENNA

(75) Inventors: Kenji Kamogawa, Yokohama; Tsuneo Tokumitsu, Yokosuka, both of (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 08/653,907

(22) Filed: May 28, 1996

(30) Foreign Application Priority Data

May 29, 1995 (JP) .............................. 7-130768

(51) Int. Cl.$^7$ ................................. H01Q 1/38
(52) U.S. Cl. ................................ 343/700 MS
(58) Field of Search .......................... 343/700 MS, 873; H01Q 1/38, 13/08

(56) References Cited

U.S. PATENT DOCUMENTS

| | | | | |
|---|---|---|---|---|
| 4,819,004 A | * | 4/1989 | Argintaru et al. ............ | 343/778 |
| 4,903,033 A | * | 2/1990 | Tsao et al. ............ | 343/700 MS |
| 5,155,493 A | * | 10/1992 | Thursby et al. ............. | 343/873 |

FOREIGN PATENT DOCUMENTS

| | | | | |
|---|---|---|---|---|
| GB | 2046530 | * | 11/1980 | .......... 343/700 MS |
| JP | 5-9221007 | | 12/1984 | |
| JP | 63-3612 | | 1/1988 | |
| JP | 1-57810 | | 4/1989 | |
| JP | 1-254008 | | 10/1989 | |
| JP | 3-182102 | | 8/1991 | |
| JP | 4-21203 | | 1/1992 | |
| JP | 4-286204 | | 10/1992 | |
| JP | 5-102721 | | 4/1993 | |
| JP | 5-129825 | | 5/1993 | |

OTHER PUBLICATIONS

"A Novel Microstrip Antenna Using Alumina–ceramic/Polyimide Multilayer Dielectric Substrate," Proceedings of the 1996 IEICE General Conference, SC–1–11/English Abstract, Mar. 28–31, 1996, Tokyo, Tokyo Institute of Technology, Tokyo, Japan.

Misao Haneishi, "Chapter 3: Evaluation of the Basic Performance of Microstrip Antennas", Analysis, Design and Measurement of Small and Low–profile Antennas, pp. 53–65, Artech House, Inc., 1992.

* cited by examiner

Primary Examiner—Michael C. Wimer
(74) Attorney, Agent, or Firm—Finnegan, Henderson, Farabow, Garrett & Dunner LLP

(57) ABSTRACT

A multifrequency-band microstrip antenna, for use in microwave to millimeter-wave band, is provided with different thicknesses of dielectric films to optimized the performance in any operating frequencies desired. In a double lamination antena substrate, for example, lamination 1 is made up of a number of dielectric films having a given dielectric constant and thickness, and lamination 2 is made up of a number of dielectric films of another given dielectric constant and thickness. An radiation element is provided between the films in lamination 2, and a ground plane is provided between the films in lamination 1. A strip conductor for propagating radio signals is provided in lamination 1 such that the ground plane intervenes between the radiation element and the strip conductor, thereby shielding the radiation element except for a slot formed in the ground plane. The input signal couples to the radiation element through the slot, thereby feeding the radiation element and operating the microstrip antenna.

15 Claims, 17 Drawing Sheets

HETEROGENEOUS MULTI-LAMINATION MICROSTRIP ANTENNA

BACKGROUND OF THE INVENTION

1. Field of the Invention

The present invention relates in general to antennas, used for transmitting and receiving radio signals in the frequency range of microwave to millimeter-wave bands, having integral power lines and high frequency circuits for signal processing. The present invention relates, in particular, to a microstrip antenna of compact and high-flexbility design, comprising a plurality of radiation elements, provided in a common unit, for use in different frequency bands.

Such an antenna would find applications in personal communication systems including entry-control and security cards, terminals for ATM wireless access (AWA), remote-access terminal and others. Because of its compact and low-profile features, the antenna is also suitable for use in interior LAN, needing a multi-band system to overcome the operational problems of fading and shadowing caused by multi-pass interference being experienced in such a network.

2. Description of the Prior Art

Microstrip antennas are being used for radar, mobile and satellite communication systems, because of their compact, thin and light weight features.

Microstrip antennas are particularly suitable for use as active antennas. Active antenna is an antenna having all of the necessary components, such as an antenna element, a feeding circuits, active devices or active circuits, integrally provided on a monolithic substrate, thus producing a compact, low cost and multi-function antenna equipment.

FIG. 14A is a perspective view of an example of the configuration of the conventional microstrip antennas, and FIG. 14B is a cross sectional view through a plane at A—A in FIG. 14A. The device includes an radiation element 102, a ground plane 101 and a dielectric film member 100. The radiation element 102, the ground plane 101 and the dielectric film member 100 constitute a microstrip antenna 104. A strip conductor 103, together with the ground plane 101 and the dielectric film member 100 constitute a microstrip line 105. A signal propagated through the microstrip line 105 couples with the antenna element 102 in accordance with the electromagnetic field generated by the microstrip line 105 and feeds the microstrip antenna 104. The microstrip 104 is a type of resonators, and the generated radio waves are radiateted into the free space.

However, in this type of microstrip antenna, the microstrip line 105 locates in the direction of radiation of the waves with respect to the ground plane 101, leading to an undesirable problem that the unnecessary radiation from the microstrip line adversely affects the radiation field of the microstrip antenna.

To resolve this problem, there has been a suggestion for a different configuration of microstrip antenna such as the one presented in FIGS. 15A, 15B.

FIG. 15A is a perspective view of another example of the conventional microstrip antennas, and FIG. 15B shows a cross sectional view through a plane at A—A in FIG. 15A. The device includes an radiation element 112, a ground plane 111 and a first dielectric film member 110. The radiation element 112, the ground plane 111 and the first dielectric film member 110 constitute a microstrip antenna 114.

The device also has a strip conductor 113 and a second dielectric film member 115. The strip conductor 113, the second dielectric film member 115 and the ground plane 111 constitute a microstrip line 116. Also, a slot 117 is fabricated on the ground plane 111.

The signal propagated through the microstrip line 116 couples with the radiation element 112 in accordance with the electromagnetic field generated by the microstrip line 116 through the slot 117, and feeds the microstrip antenna 114.

The unnecessary radiation from the microstrip line 116 in the microstrip antenna shown in FIGS. 15A and 15B generates little adverse effects on the radiation field of the microstrip antenna 114, because the ground plane 111 intervenes and blocks the parasitic signals from the microstrip line 116 (acting as the power line) affecting the performance of the radiation element 112.

The properties of the microstrip antennas shown in FIGS. 14A, 14B and FIGS. 15A, 15B can be obtained from the dielectric constant, the dielectric dissipation factor (tan$\delta$) and the thickness (h) of the first dielectric film substrate 110 (or 100), and the conductivity ($\sigma$) of the radiation element 102 or 112.

FIG. 16 is a graph showing the relationship between the radiation efficiency and no-load Q of a circular microstrip antenna without considering the effect of the surface wave (refer to K. Hirasawa and M. Haneishi, "Analysis, Design, and Measurement of Small and Low-Profile Antennas", Artech House, Norwood, Mass. 02062).

In this case, if S is the voltage standing wave ratio (VSWR), the bandwidth BW of the microstrip antenna is given by the following equation:

$$BW = (S-1)/Q_o S^{0.5}.$$

Therefore, the bandwidth of an antenna is inversely proportional to no-load Q, and, to obtain high performance properties in an antenna (high radiation efficiency, wide bandwidths etc.), FIG. 16 shows that it is preferable to have a thick dielectric film.

However, when the thickness h exceeds a certain value, the antenna performance becomes degraded because the loss caused by surface waves can no longer be ignored and higher order excitations are generated in the thickness direction. Therefore, in designing a high-performance antenna, the thickness of the dielectric film is the most important parameter. For microstrip antennas in general, the thickness of the dielectric film is chosen in the range of ⅕₀th to ¹⁄₂₀th of the free-space wavelength of the center frequency.

Although microstrip antennas are convenient and advantageous in many respects, they operate in a single frequency band and has a high Q-value, and therefore, if they are to find a wider application possibilities, increased bandwidth of the antenna is mandatory.

An attempt has been made to solve these problems by developing a dual-frequency microstrip antenna which is shown in FIGS. 17A, 17B.

FIG. 17A shows a plan view of a dual-frequency microstrip antenna, and FIG. 17B shows a cross sectional view through a plane at A—A in FIG. 17A. The antenna shown in this drawing is made by laminating two dielectric films 100 having one radiation element 102 between the two films and another radiation element 102 of the same size above the top film 100. Operating power is supplied to each of the radiation elements 102 through a power pin 200 formed on a ground plane 101 which is disposed opposite and away from the radiation element.

In this device, the boundary conditions of the electric and magnetic field components of the top and bottom dielectric films 100 coupled to each of the radiation elements 102 (disposed above and below the dielectric film member 100) are different, thereby providing different equivalent dielectric constants to enable the antenna to perform as a dual-frequency microstrip antenna.

More specifically, denoting the dielectric constant for the upper dielectric film 100 by $\epsilon r1$ and that for the lower dielectric film 100 by $\epsilon r2$, the equivalent dielectric constant of the upper radiation element can be approximated by $(\epsilon r1+1)/2$ and that for the lower radiation element by $(\epsilon r1+\epsilon r2)/2$.

For popular film base material such as teflon or polytetrafluoroethylene (PTFE) whose relative dielectric constants $\epsilon r$ are about 2.55, there is little change in the equivalent dielectric constant, and the two radiation elements resonate in a close range of frequencies.

Therefore, there are cases in which an optimum film substrate thickness for one radiation element is not optimum for the other radiation element, resulting in degradation in the radiation efficiency and bandwidth of the overall antenna.

Another type of microstrip antenna designed to overcome the problems discussed above is shown in FIGS. 18A, 18B. FIG. 18A is a plan view of the antenna and FIG. 18B shows a cross sectional view through a plane A—A in FIG. 18A.

This type of antenna is provided with two different sizes of radiation elements 102a, 102b. Thus, the large radiation element 102a provided on the top film acts as a low frequency-band antenna, and the small radiation element 102b provided on the lower film acts as a high frequency-band antenna, thereby permitting to choose an optimum film thickness for each of the two dielectric films 100.

However, the dual-frequency microstrip antennas shown so far are designed with a power pin 200, thus leading to an undesirable effect of unnecessary radiation from the power pin affecting the radiation fields of the radiation elements.

A microstrip antenna shown in FIGS. 19A, 19B is an attempt to solve the problems posed by the antennas presented above. FIG. 19A is a plan view of another example of a dual-frequency antenna, and FIG. 19B is a cross sectional view through a plane at A—A in FIG. 19A.

The dual-frequency antenna is provided with a strip conductor 113 opposite to the top and bottom radiation elements 102a, 102b with an intervening ground plane 101. Each of the radiation elements 102a, 102b is coupled to the strip conductor 113 in its respective electromagnetic field, and are activated th rough a slot 117.

In this type of antenna also, two different sized radiation elements 102a, 102b are provided as in the case of the antenna shown in FIGS. 18A, 18B. Therefore, the top radiation element 102a acts as a low frequency antenna, and the bottom radiation element acts as a high frequency-band antenna, thereby permitting to choose an optimum film thickness for each of the two dielectric films 100.

However, in the conventional dual-frequency antennas presented so far, it has been difficult to fabricate more than three microstrip radiation elements having distinct operating frequency on a common dielectric film member to realize a multi-band antenna.

A microstrip antenna shown in FIGS. 20A, 20B is an attempt to solve these problems posed by the antennas presented above. FIG. 20A is a plan view of another example of a dual-frequency antenna, and FIG. 20B is a cross sectional view through a plane at A—A in FIG. 20A.

The antenna shown in FIG. 20A is provided with half-wavelength dipoles 201a~201f having different resonant lengths printed on a dielectric film member 100, and opposite to the dipoles 201a~201f, there is provided a strip conductor 113 with an intervening ground plane 101. Each of the dipoles 201a~201f couples with the strip conductor 113 in its respective electromagnetic field through a slot 117, and is activated to generate signal waves of different frequencies, thereby performing as a multifrequency-band antenna.

However, because such a dual-frequency microstrip antenna is designed so that the half wavelength dipoles 201a~201f are all printed on a common dielectric film member 100, and consequently, the frequency range for optimum performance is limited.

Further limitation of the antenna configuration based on the printed dipoles 201a~201f is that, because the dipoles are meant to couple through the slot 117, there is a physical limitation to the number of dipoles which can be arranged within the coupling distance of the slot 117.

Therefore, it is difficult to fabricate simultaneously two microstrip radiation elements, having a widely separated operating frequencies, on a common dielectric film substrate using the approach shown in FIGS. 20A, 20B. In other words, the conventional dual-frequency microstrip antenna could not provide a multi-band capability in one device unit which performs well in any desired operating frequencies over a wide range of frequencies.

SUMMARY OF THE INVENTION

It is an object of the present invention to provide a compact and multi-function microstrip antenna of multi-band capability having a plurality of dielectric films of thicknesses, which are optimized for a plurality of different operating frequencies, fabricated on a monolithic substrate, so as to provide optimal performance in the operating frequency range of microwave to millimeter-wave, in such a manner as to facilitate the incorporation of integrated circuits within -the antenna.

The object is achieved in an antenna comprising: a multi-lamination microstrip antenna comprising: a plurality of dielectric laminations, each lamination comprising: a plurality of dielectric film members, each dielectric film member having a selected dielectric constant and a selected film thickness; an radiation element in contact with a film surface of one dielectric film member disposed in one lamination; and a ground film member, in functional association with the radiation element, in contact with another film surface of another dielectric film member disposed in another lamination different than the one lamination.

A further aspect of the invention is that the antenna may be provided with: a high frequency signal line, disposed opposite to the radiation element with the ground plane intervening between the high frequency signal line and the radiation element, in contact with a film surface of a dielectric film member in a lamination; and a slot formed on the ground film member for receiving input signals into the radiation element so as to enable the input signals to couple with the radiation element in accordance with the electromagnetic field generated by the high frequency signal line to drive the radiation element.

A further aspect of the invention is that the antenna may be provided with: a high frequency signal line, disposed opposite to the radiation element with the ground plane intervening between the high frequency signal line and the radiation element, in contact with a film surface of a dielectric film member in a lamination; a slot formed on the ground film member; and a conductor member for operatively connecting an end of the high frequency signal line with the radiation element, so as to produce a direct electrical connection to drive the radiation element.

An aspect of the antenna presented above is that the conductor member is an open ended cavity termed a via-hole.

Still another aspect of the antenna presented above is that the high frequency signal line is a microstrip line.

Still another aspect of the antenna presented above is that wherein the high frequency signal line is a tri-plate line.

Still another aspect of the antenna presented above is that the antenna is provided with a plurality of the radiation elements.

Still another aspect of the antenna presented above is that the antenna is provided with electronic circuit means for processing signals received by and transmitting from the radiation element, disposed in contact with a dielectric film member in a lamination.

Still another aspect of the antenna presented above is that the antenna is provided with electronic circuit means for processing antenna signals in operative contact with the ground film member.

Still another aspect of the antenna presented above is that a cavity space is formed by removing at least one dielectric film member.

Still another aspect of the antenna presented above is that circuit element means are provided at an interface between the dielectric film members.

Still another aspect of the antenna presented above is that the circuit element means are capacitors.

Still another aspect of the antenna presented above is that the circuit element means are resistors.

Still another aspect of the antenna presented above is that the dielectric film member is an alumina ceramic material.

The final aspect of the antenna presented above is that the dielectric film member is a polyamide film.

The outstanding features of the invention are summarized below.

The multi-lamination configuration of the present microstrip antenna allows radiation elements and ground planes to be placed between any dielectric film members, allows the film thickness to be selected freely and successively to meet a wide range of operating frequency bands, and allows equi-potential connection to the ground planes to be made through the corresponding open ended cavities or via-holes.

Therefore, it is possible to select a thickness of any dielectric film so as to optimize the performance of an radiation element for a specific operating frequency within a wideband frequency range, thereby producing a microstrip antenna capable of handling a large separation in the receiving and transmitting frequencies or in the operating frequency bands.

Lamination thickness and the film thickness can be freely selected to suit any requirement, therefore, it possible to produce a multifrequency-band antenna on a monolithic substrate, capable of operating in a plurality of different operating frequency bands within frequency range of microwave to millimeter-wave. Furthermore, the design of the antenna allows two or more radiation elements having slightly different resonant frequencies to be provided on different local regions of one thin dielectric film member, thereby permitting to increase the bandwidth of the antenna without degrading the performance of either radiation element.

Further, because the dielectric constant of each of the film members can be freely selected, selection of a film material having a high dielectric constant allows a reduction in the size of the radiation element, and the selection of a film material having a low dielectric constant material allows an increase in the gain and efficiency of the antenna.

By selecting such materials as alumina, aluminum nitride and silicon as the film material for their good thermal compatibility with the semiconductor substrate often used in such applications, it is not only possible to incorporate a microstrip antenna into a monolithic microwave integrated circuit (MMIC) formed on a semiconductor substrate, but also to produce a multi-function antenna by enabling such functions as active antenna to be incorporated into the antenna.

Further, such an active radiation element can be produced economically because capacitor and resistor elements can be placed at the interface between appropriate film members, thereby allowing to integrate active devices or active circuits with the antenna, without the need for installing chip condensers. This approach to circuit integration permits the use of Wilkinson divider to configure power combining circuits, thereby lowering the mutual coupling between antenna elements through the feeding circuits.

Further, the lamination structure allows a higher degree of freedom in designing power and biasing lines, compared with the conventional designs, because these elements can be placed in any suitable lamination and it allows more choices of circuits and means for power supply. More specifically, the lamination structure permits power to be supplied directly using the via-holes and signal coupling to be achieved through the slots. It offers a further advantage that power combining circuits can be either a microstrip or a tri-plate line configuration, so that shorting interconnections which are effective in suppressing undesired modes which plague the tri-plate line configuration can be achieved by using via-holes rather than soldering used in the conventional approach.

DESCRIPTION OF THE PREFERRED EMBODIMENTS

In the following, various embodiments will be explained with reference to the drawings.

Figure 1A:
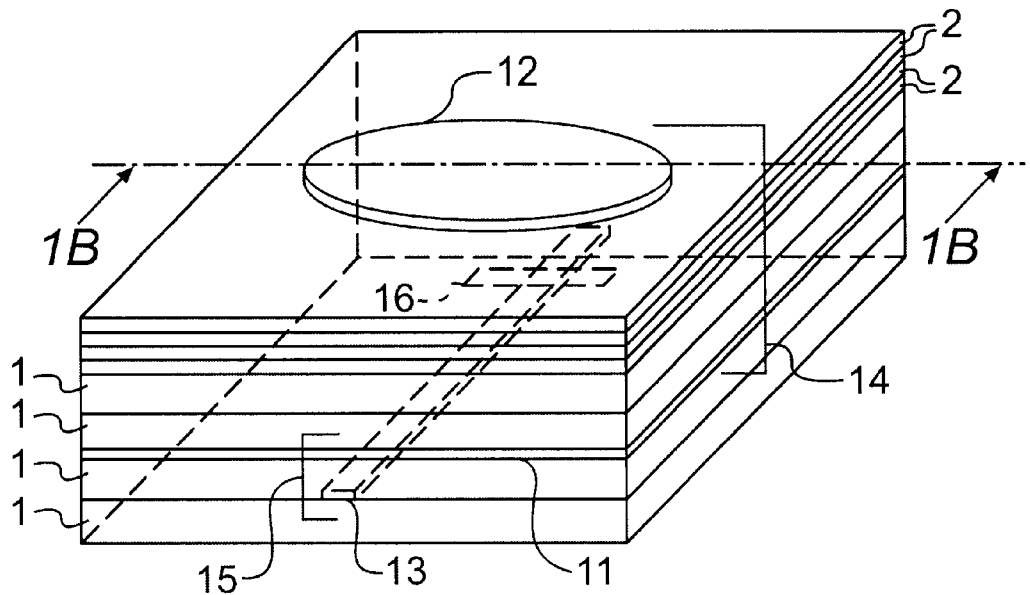
FIG. 1A is a perspective view of the antenna of embodiment 1 of the present invention.
Figure 1B:
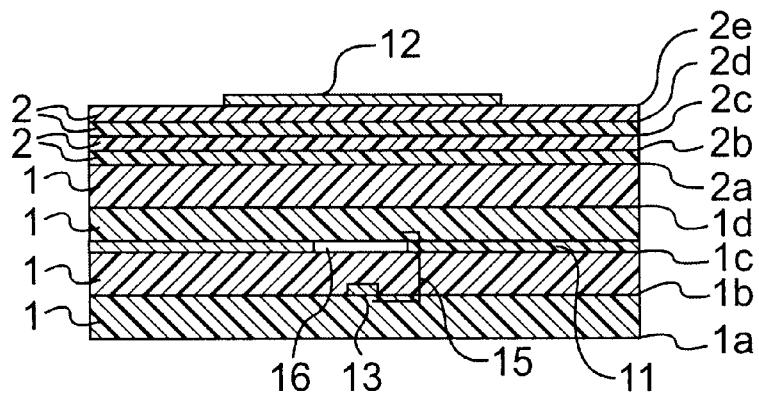
FIG. 1B is a cross sectional view through a plane at A—A in FIG. 1A.

FIG. 1A is a perspective view of the antenna of embodiment 1, and FIG. 1B is a cross sectional view through a plane at A—A in FIG. 1A.

The following reference numerals are used to describe the antenna: first dielectric film members 1 constituting lamination 1; second dielectric film members 2 constituting lamination 2; a ground plane 11; a radiation element 12; strip conductor 13; a microstrip antenna 14; a microstrip line 15; and a slot 16.

Film surfaces of each of the dielectric film members 1 and 2 are designated in FIG. 1A as, starting at the bottom, 1a, 1b, 1c, 1d and 2a, 2b, 2c, 2d and 2e. The ground plane is fabricated on the film surface 1c, and the radiation element 12 is fabricated on the film surface 2e.

The radiation element 12 functions as a microstrip antenna 14 in conjunction with the first and second dielectric film members 1 and 2, formed above the film surface 1c, serving as the dielectric substrate for the radiation element 12.

The microstrip line 15 is constituted by the strip conductor 13 fabricated on the film surface 1b in conjunction with the first dielectric film member 1 and the ground plane 11.

The microstrip antenna 14 operates as follows. A signal propagating through the microstrip line 15 couples with the radiation element 12 in accordance with the electromagnetic field generated by the microstrip line 15 through the slot 16 provided on the ground plane 11 so as to feed the microstrip antenna 14.

When the microstrip antenna 14 (acting as a resonator) is excited, radio waves are radiateted upwards into the free space in FIG. 1B.

According to the configuration of embodiment 1 shown in FIG. 1, the ground plane 11 and the radiation element 12 may be located between first or second dielectric film members 1 or 2, in either lamination 1 or 2.

Further, the film thickness of the second dielectric film member 2 is selected to be less than that of the first dielectric film member 1. Therefore, as shown in embodiment 2 shown in FIG. 2, by changing the locations of the ground plane and the radiation element as indicated by 11a and 12a, the film thickness for the dielectric film member can be freely altered as need, to optimize the performance of the microstrip antenna by selecting an optimum substrate thickness for each operating frequency. Accordingly, even in cases of widely separated transmission and reception frequencies or widely different operating frequency bands, it becomes possible to make a microstrip antenna, exhibiting a high performance in any frequency band, on one common substrate.

Figure 2:
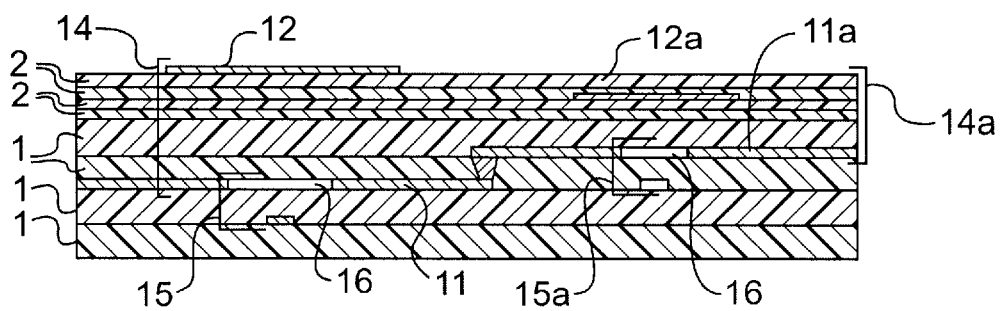
FIG. 2 is a cross sectional view of the antenna of embodiment 2 of the present invention.

Also, the antenna shown in FIG. 2 is able to suppress unnecessary radiation from the microstrip lines 15, 15a, because the microstrip lines 15, 15a are shielded from the radiation elements 12, 12a, respectively, by the ground planes 11, 11a.

Also, the radiation element 12 can be miniaturized by using such materials as alumina, aluminum nitride and silicon for the first dielectric film member 1. The values of the thermal expansion coefficient for these materials are quite compatible with the expansion values of semiconductor materials commonly used in making devices for the frequency range of microwave to millimeter-wave, therefore, it facilitates fabrication of integrated electronic circuits on the semiconductor substrate, thereby realizing active antenna systems.

By arranging the dielectric constant for the second dielectric film member 2 to be less than that for the first dielectric film member 1, the equivalent dielectric constant at high frequencies for the microstrip antenna can be made small to produce a antenna with wide bandwidth characteristics.

Figure 3A:
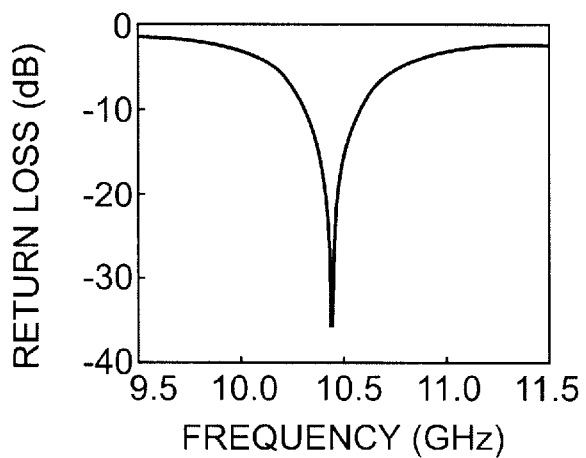
FIG. 3A is a graph showing the results of measurement of return loss for a microstrip antenna having a 10 GHz band.
Figure 3B:
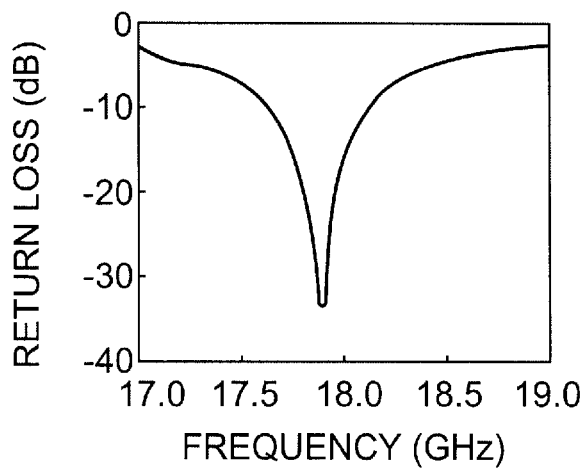
FIG. 3B is a graph showing the results of measurement of return loss for a microstrip antenna having an 18 GHz band.

FIGS. 3A, 3B are graphs showing the return loss of a microstrip antenna of the configuration shown in FIG. 2. The device is provided with both a 10 GHz band and an 18 GHz band. FIG. 3A shows the antenna performance in the 1 GHz band and FIG. 3B shows the same in the 18 GHz band.

The structural parameters for the first and second dielectric film members 1, 2, and those for the 10 GHz band and the 18 GHz band are shown in Tables 1 and 2.

In the microstrip antenna used for these measurements, the feeding line is provided on the same side as the radiation element 12 but shielded by the ground plane 11 to enable on-wafer measurement, and the power is supplied directly to the line through a through-hole provided on the top surface of the wafer.

The locations of the radiation element, the ground plane and the core conductor of the microstrip line referred to in Tables 1, 2 are indicated on the film surfaces 1a, 1c, 2a and 2c in FIG. 1B.

TABLE 1

| Properties | First Dielectric Film | Second Dielectric Film |
|---|---|---|
| Specific Dielectric Constant | 9.6 | 3.3 |
| Number of Films | 4 | 4 |
| Lamination Thickness | 250 μm | 25 μm |

TABLE 2

| Properties | 10 GHz Band | 18 GHz Band |
|---|---|---|
| Location of Radiation Element | 2e | 2e |
| RE Resonant Length | 5 mm | 3.2 mm |
| RE width | 3 mm | 1.8 mm |
| Location of Ground Member | 1a | 1c |
| Location Strip Conductor | 1c | 2a |
| Center Frequency | 10.43 GHz | 17.87 GHz |
| Film Thickness | 0.038λ0 | 0.036λ0 |
| Bandwidth (VSWR<2) | 2.8% | 2.9% |

Notes: RE - radiation element;
VSWR - voltage standing wave ratio

From FIGS. 3A, 3B, it can be seen that it is possible to provide two antenna functions (10 GHz band antenna and 18 GHz band antenna) of widely separated frequency bands of about the same bandwidth in one microstrip antenna.

Further, because the dielectric constant and the film thickness for the second dielectric film members 2 for lamination 2 is less than those for the first dielectric film members 1 for lamination 1, it would be possible to manufacture a microstrip antenna having a frequency band in excess of 200 GHz by using the multi-lamination configuration shown above. It should be noted that, in this case, the film thickness would be 1/50 to 1/20 of the wavelength of the center frequency. It has thus been demonstrated that it is possible to manufacture a microstrip antenna having any desired number of operating frequency bands.

Figure 4:
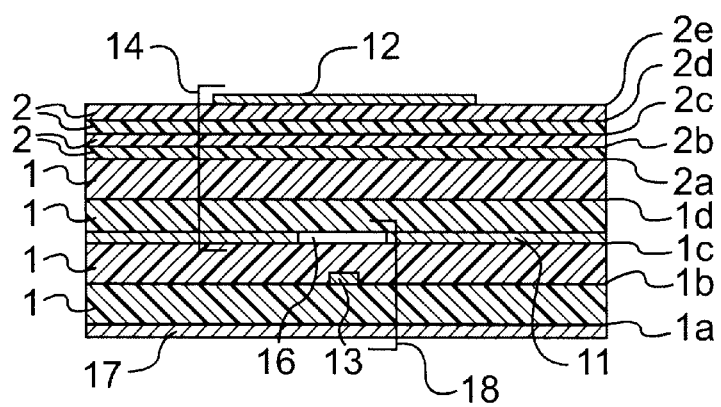
FIG. 4 is a cross sectional view of the antenna of embodiment 3 of the present invention.

FIG. 4 is a cross sectional view of an antenna of embodiment 3. The same reference numerals as those shown in FIGS. 1A, 1B have been retained.

As in FIGS. 1A, 1B, the antenna comprises: lamination 1 having first dielectric film members 1; lamination 2 having second dielectric film members 2; and the film surfaces are, starting from the bottom, 1a, 1b, 1c, 1d, 2a, 2b, 2c, 2d and 2e. A ground plane 11 is provided on the film surface 1c, a ground plane 17 is provided on the film member 1a and an radiation element 12 is provided on the film member 2e.

Antenna structure 12 functions as a microstrip antenna 14 in conjunction with the dielectric film members 1 and the dielectric film members 2, provided above the film surface 1c, serving as the laminated dielectric bases therefor.

The strip conductor 13 is provided on the film surface 1b. The strip conductor 13, the dielectric film members 1, the ground plane 11 and the ground plane 17 constitute a tri-plate line 18.

The operation of the antenna will be explained below.

A signal propagated through the tri-plate line 18 couples with the radiation element 12, in accordance with the electromagnetic field, through the slot 16, and feeds the microstrip antenna 14. The microstrip antenna 14 acting as a resonator radiates signal waves upwards into the free space shown in FIG. 4.

In the conventional design of a tri-plate line, there has been a problem of noise generation due to the parallel mode (transverse excitation mode, TEM, waves) causing power leakage and undesired coupling and similar interference problems. These problems can be resolved by providing shorting pins for the ground planes in the vicinity of the supply point (slot), however, according to the antenna configuration of embodiment 3, shorting pin connection can be replaced with a through-hole (open ended cavity), so as not to resort to solder connections as in the conventional antenna.

Figure 5:
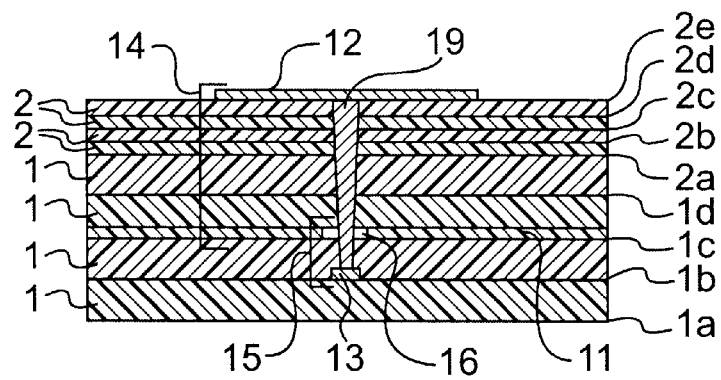
FIG. 5 is a cross sectional view of the antenna of embodiment 4 of the present invention.

FIG. 5 is a cross sectional view of the antenna of embodiment 4. The same reference numerals for the components have been maintained.

The antenna comprises: lamination 1 having first dielectric film members 1; lamination 2 having second dielectric film members 2; and the film surfaces are, respectively from the bottom, 1a, 1b, 1c, 1d, 2a, 2b, 2c, 2d and 2e. A ground plane 11 is provided on the film surface 1c, and an radiation element 12 is provided on the film member 2e.

The radiation element 12 functions as a microstrip antenna 14 in conjunction with the first dielectric film members 1 and the second dielectric film members 2, provided above the film surface 1c, serving as the dielectric laminated substrate therefore.

The strip conductor 13 is provided on the film surface 1b. The strip conductor 13, the first dielectric film member 1, the ground plane 11 constitute a microstrip line 18.

The operation of the microstrip antenna will be explained below.

A signal propagated through the microstrip line 15 feeds the microstrip antenna 14 directly through the via-hole (open ended cavity) 19. The microstrip antenna 14 acting as a resonator radiates signal waves upwards into the free space shown in FIG. 4.

Figure 6:
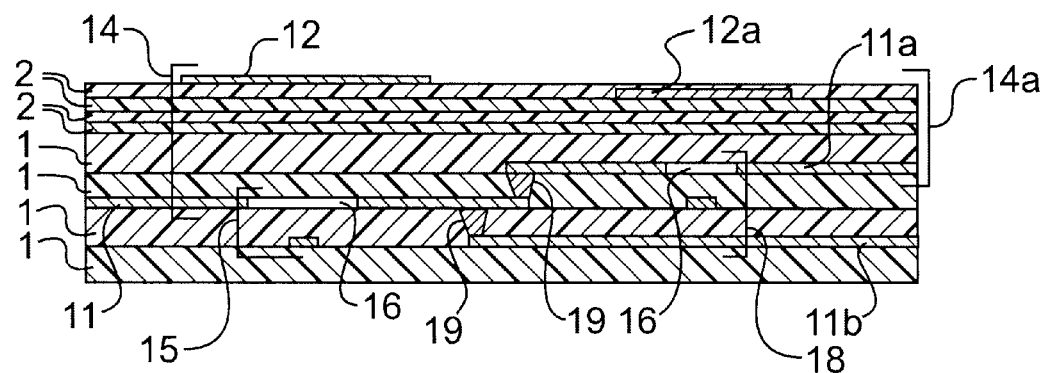
FIG. 6 is a cross sectional view of the antenna of embodiment 5 of the present invention.

FIG. 6 is a cross sectional view of an antenna of embodiment 5. The same reference numerals for the components as those used above are retained.

In this embodiment, two different power combining circuits configuration, a microstrip line 15 and a tri-plate line 18, are integrated in one substrate. The antenna of the present invention is compatible with different feeding methods as demonstrated in this embodiment.

Figure 7A:
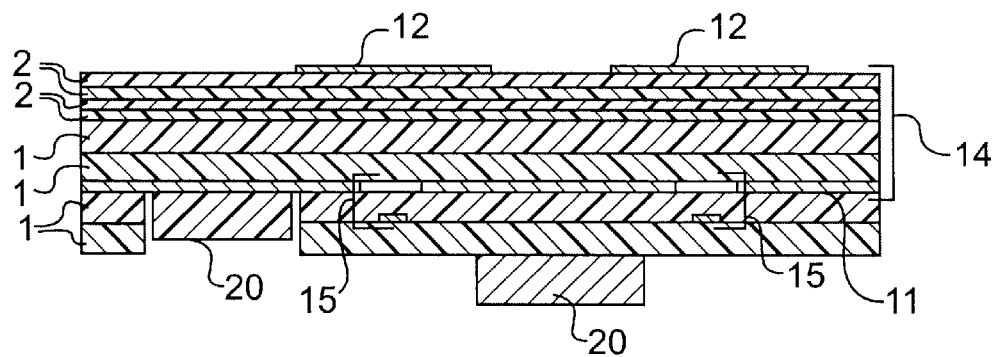
FIGS. 7A, 7B are cross sectional views of the antenna of embodiment 6 of the present invention.
Figure 7B:
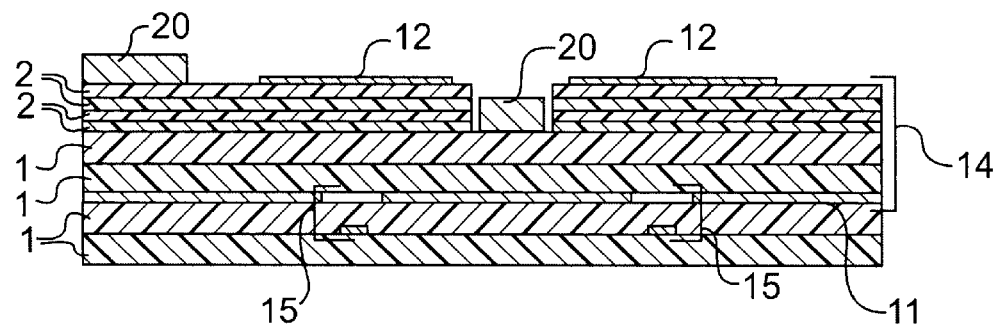

FIGS. 7A, 7B are cross sectional views of an antenna of embodiment 6. The components are mostly the same as before but an electronic circuit has been added.

In this embodiment device, the electronic circuits 20, which is fabricated on the semiconductor substrate, are integrated with the microstrip antenna.

There are two electronic circuits 20 provided for each of the antennas shown in FIGS. 7A, 7B, but the circuits are located in different regions of lamination 1.

In more detail, in the antenna shown in FIG. 7A, a local region of lamination 1 has be en removed to expose a portion of the ground plane 11, and one of the electronic circuits 20 is buried in the bared area. The other circuit 20 is located on the external film surface of the outermost dielectric film member 1.

In contrast, in the antenna shown in FIG. 7B, a local region of the lamination 2 has been removed to produce a cavity, wherein one electronic circuit 20 is mounted on the exposed surface of the first dielectric film member 1 while the other electronic circuit 20 is mounted on the external surface of the outermost film member 2 in lamination 2.

As demonstrated in this embodiment, the microstrip antenna of the present invention not only minimizes transmission loss between the high frequency circuit and the radiation element by integrating the radiation element with the electronic circuits fabricated on the semi-conductor substrate but also enables to produce a compact and low-profile active antennas of various configurations including phased-array antenna.

Additionally, the technique of removing a local region of the lamination substrate and mounting the electronic circuit on the bared region of the dielectric film member enables to shorten the length of the wire connecting the electronic circuit and the high frequency line, thereby further decreasing the transmission loss as well as the antenna thickness. The design of the antenna further allows the heat generated in the electronic circuits to be radiated effectively by sharing the ground plane 11 for the circuits as well as for the microstrip antenna 14, or by forming the circuits on a substrate material having compatible thermal expansion characteristics.

In each of the embodiments shown above, one radiation element has been provided for one antenna, but it is obvious that, the arrangement concept can be applied equally well to an array antenna having a plurality of antenna strictures.

Also, in each of the foregoing embodiments, circular microstrip antenna have been shown, but it is permissible to utilize any other shapes such as rectangular, triangular and so on.

Figure 8A:
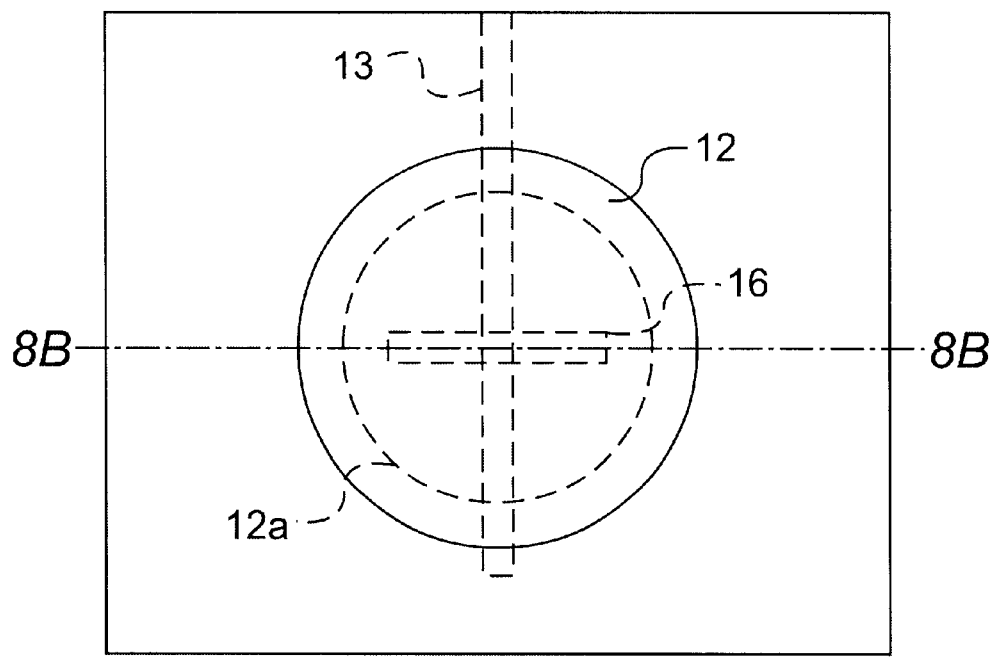
FIG. 8A is a plan view of the antenna of embodiment 7 of the present invention.
Figure 8B:
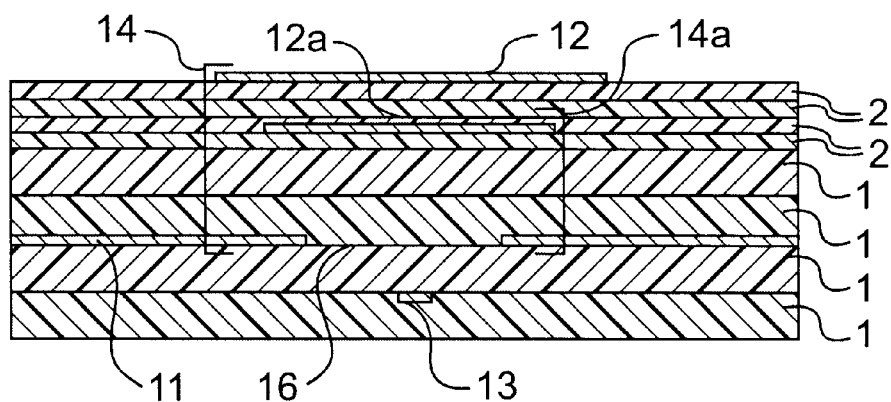
FIG. 8B is a cross sectional view through a plane at A—A in FIG. 8A.

FIG. 8A is a plan view of embodiment 7. FIG. 8B is a cross sectional view through a plane at A—A in FIG. 8A. The same reference numerals are retained, and their explanations are omitted.

The microstrip antenna of embodiment 7 is provided with a large radiation element 12 for low frequency range on the external surface of lamination 2, and a smaller radiation element 12a is provided between the dielectric film members in lamination 2.

Figure 9A:
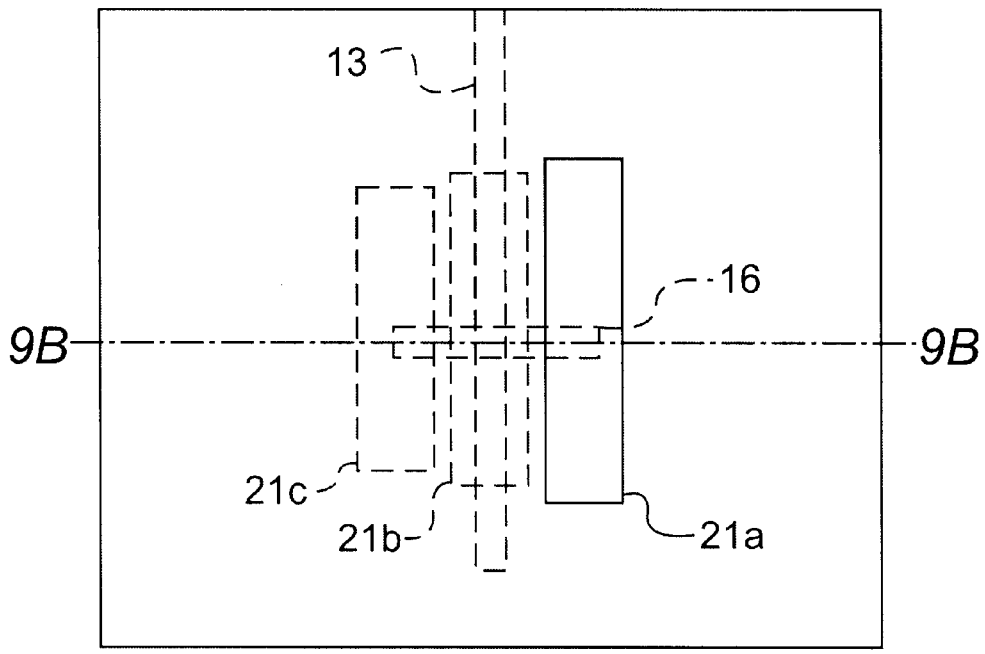
FIG. 9A is a plan view of the antenna of embodiment 8 of the present invention.
Figure 9B:
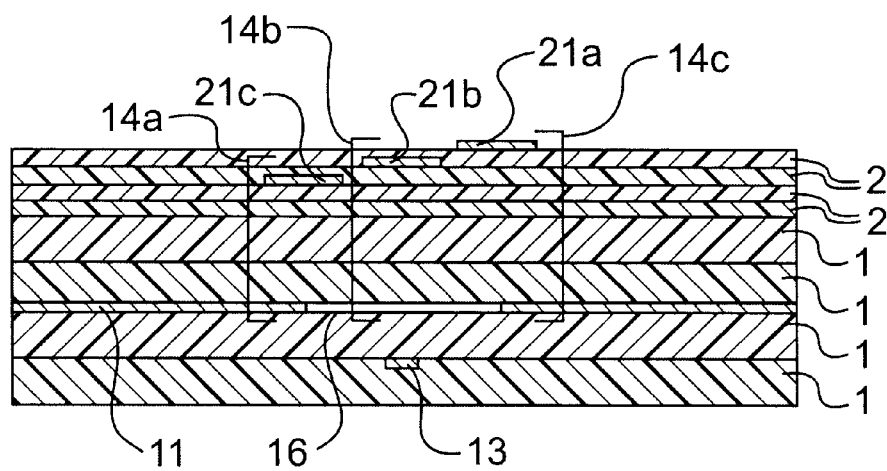
FIG. 9B is a cross sectional view through a plane at A—A in FIG. 9A.

FIG. 9A is a plan view of embodiment 8. FIG. 9B is a cross sectional view through a plane at A—A in FIG. 9A. The same reference numerals are retained, and their explanations are omitted.

The microstrip antenna of embodiment 8 is provided with half wavelength printed dipoles 21a~21c of different resonant lengths in lamination 2, either on the outer surface of the lamination or between the film members.

The microstrip antennas shown in FIGS. 8A, 8B and 9A, 9B enable to not only increase the bandwidths of the radiation elements by providing two or more radiation elements having slightly different resonant frequencies on different local regions of a thin dielectric film member, thereby permitting to increase the bandwidths without degrading the performance of either radiation element, as well as to optimize the thickness of the dielectric film for each radiation element. In other words, the antenna of embodiments 7, 8 enable to increase bandwidths without degrading the performances of the radiation elements.

It should also be noted that, in embodiment 6, a local region of lamination 1 or 2 was removed for the insertion of an electronic circuit, but it is also conceivable to insert an radiation element or to leave it bare.

Figure 10A:
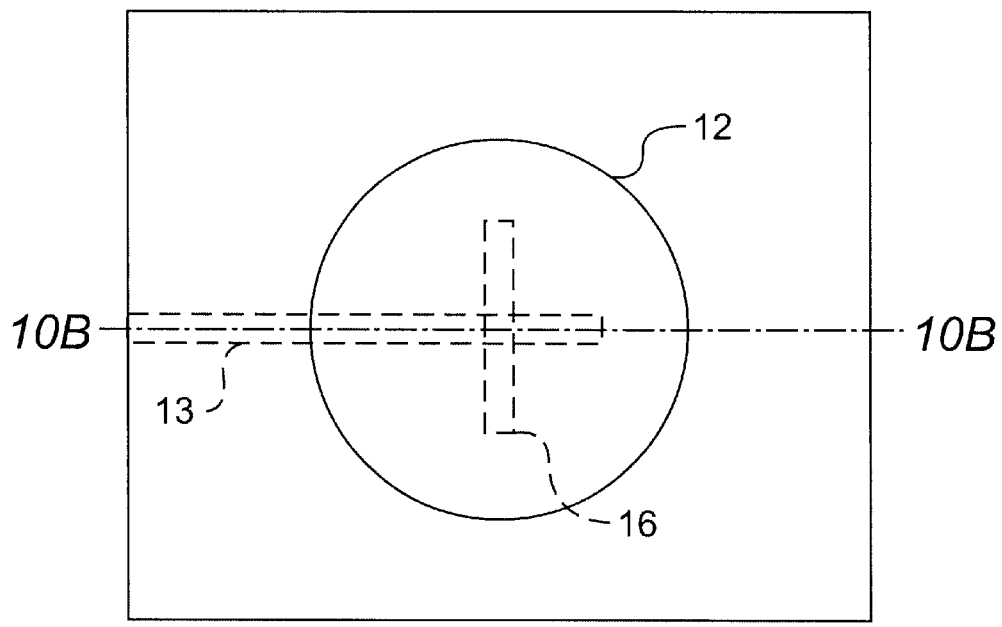
FIG. 10A is a plan view of the antenna of embodiment 9 of the present invention.
Figure 10B:
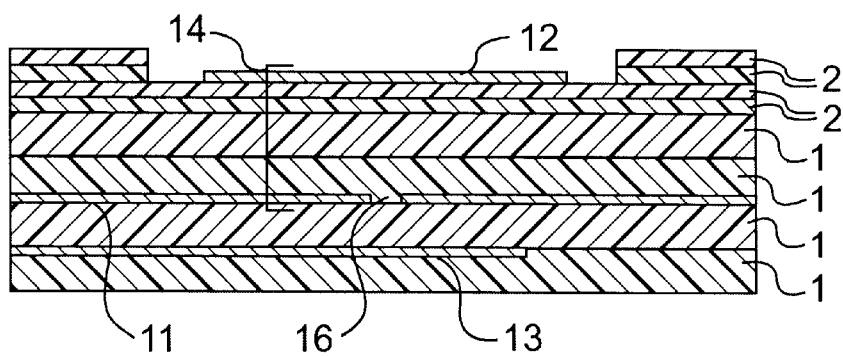
FIG. 10B is a cross sectional view through a plane at A—A in FIG. 10A.

FIG. 10A is a plan view of the antenna of embodiment 9. FIG. 10B is a cross sectional view through a plane at A—A in FIG. 10A. The same reference numerals are retained, and their explanations are omitted.

In the microstrip antenna of embodiment 9, a local region of a second dielectric film member 2 in lamination 2 has been removed, and an radiation element 12 has been fabricated on the exposed film surface of the bared region, thereby minimizing the dielectric loss in the microstrip antenna 14 and increasing the gain and the radiation efficiency of the radiateted signal waves.

Figure 11A:
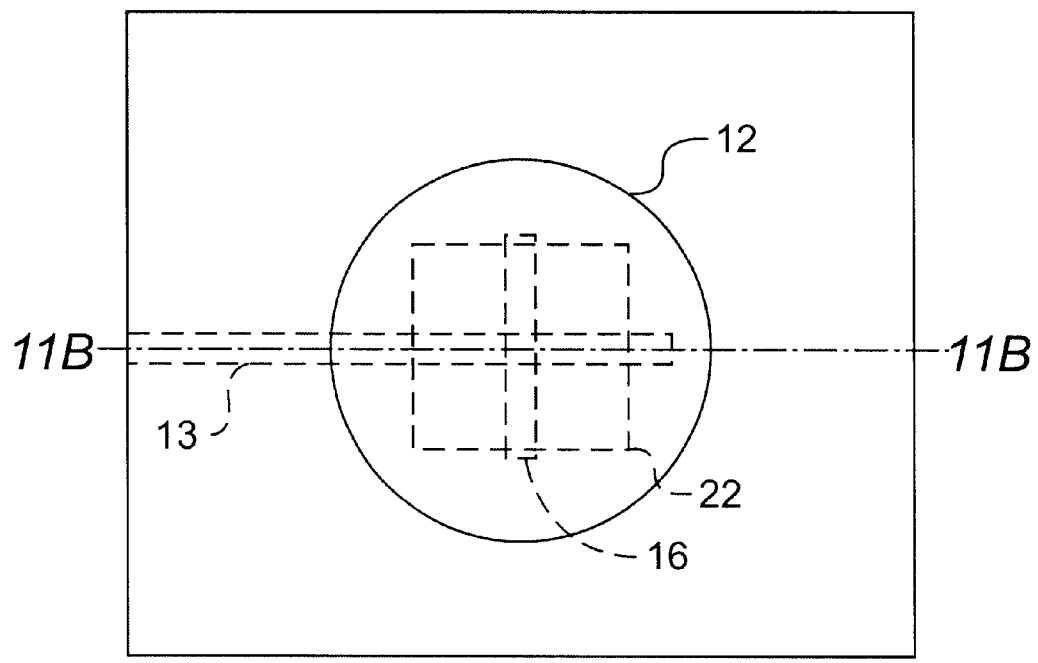
FIG. 11A is a plan view of the antenna of embodiment 10 of the present invention.
Figure 11B:
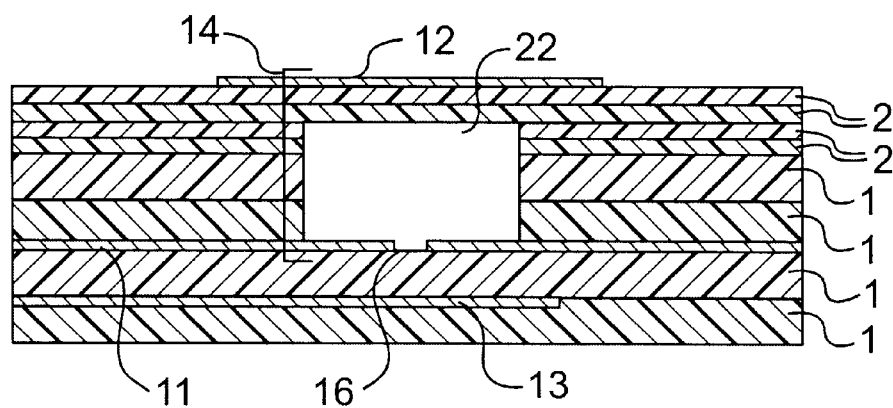
FIG. 11B is a cross sectional view through a plane at A—A in FIG. 11A.

FIG. 11A is a plan view of the antenna of embodiment 10. FIG. 11B is a cross sectional view through a plane at A—A in FIG. 11A. The same reference numerals are retained, and their explanations are omitted.

In the antenna of embodiment 10, a space is produced below the radiation element 12, by removing a part of the dielectric films 1 and 2 in laminations 1 and 2, thereby lowering the equivalent dielectric coefficient of the microstrip antenna 14 and improving the gain and the bandwidth.

Further, in any of the foregoing embodiments, it is possible to provide various circuit components (capacitors and resistances etc.) in the bonding interfaces between the first and second dielectric film members.

Figure 12A:
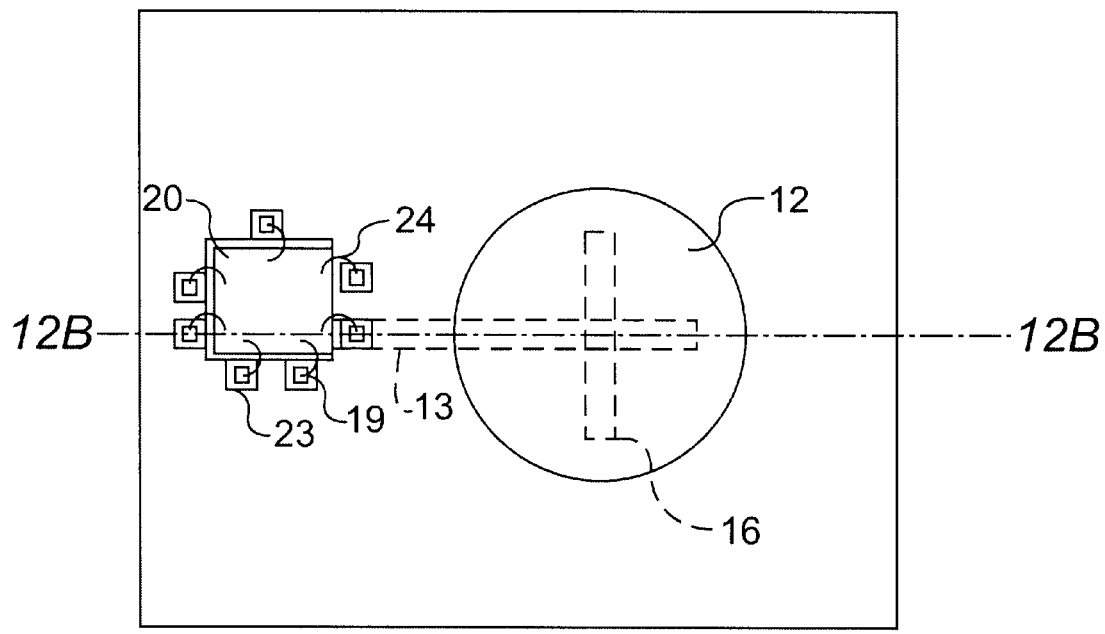
FIG. 12A is a plan view of the antenna of embodiment 11 of the present invention.
Figure 12B:
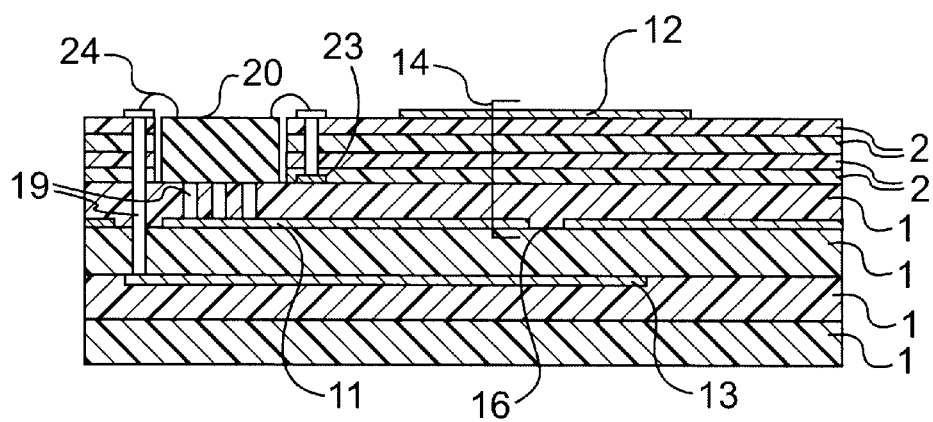
FIG. 12B is a cross sectional view through a plane at A—A in FIG. 12A.

FIG. 12A is a plan view of an antenna of embodiment 11. FIG. 12B is a cross sectional view through a plane at A—A shown in FIG. 12A. The same reference numerals are retained, and their explanations are omitted.

In the microstrip antenna of this embodiment, a capacitor member 23 is disposed at the bonding interface between laminations 2 and 1, i.e., the bottom film surface of the second dielectric film members 2 and the top film surface of the dielectric film member 1. The capacitor member 23 is electrically connected to an electronic circuit 20 through a via-hole 19 and a bonding wire 24. By adopting such a design, it becomes possible to eliminate a DC-biased chip condenser which is essential in installing certain electronic circuit 20 (functional device and monolithic microwave integrated circuit (MMIC) chip etc.), thereby lowering the cost of producing the active antenna by eliminating the cost of installing such DC biased chip condenser.

If a resistor is installed, it may be utilized for a Wlkison divider to provide a superior inter-terminal isolation, thereby decreasing the adverse effects of interactions between the radiation elements due to the power combining circuit incompatibility.

Further, in each of the foregoing embodiments, two laminations of dielectric film members (first and second dielectric film members) are used, but it should be noted that there is no particular limitation in the number of laminations which can be produced.

Figure 13A:
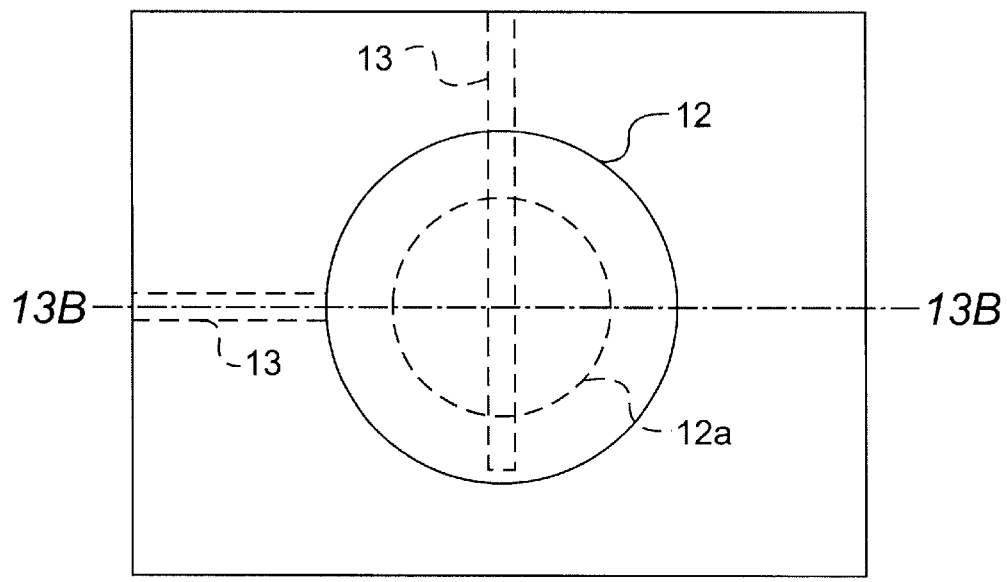
FIG. 13A is a plan view of the antenna of embodiment 12 of the present invention.
Figure 13B:
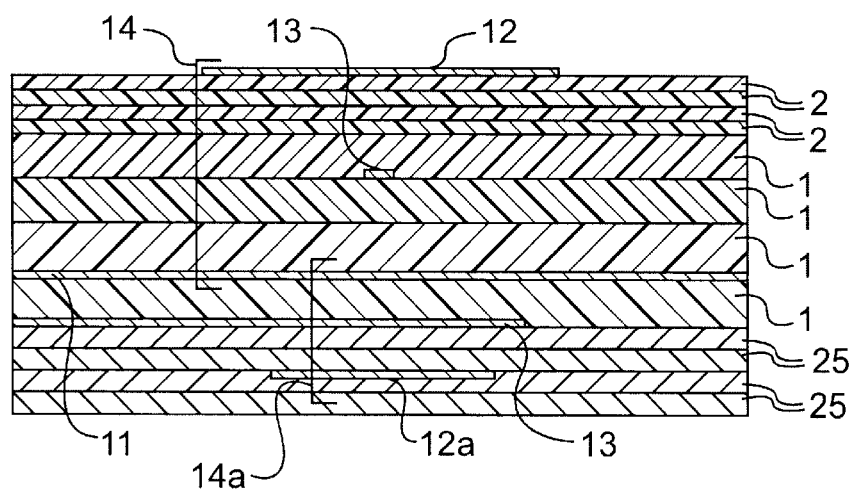
FIG. 13B is a cross sectional view through a plane at A—A in FIG. 9A.
Figure 14A:
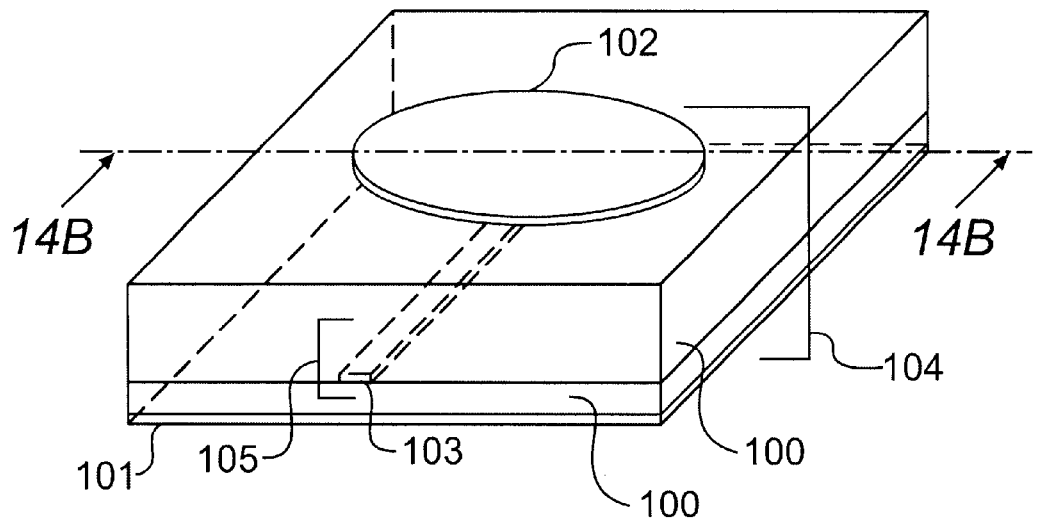
FIG. 14A is a perspective view of a conventional microstrip antenna.
Figure 14B:
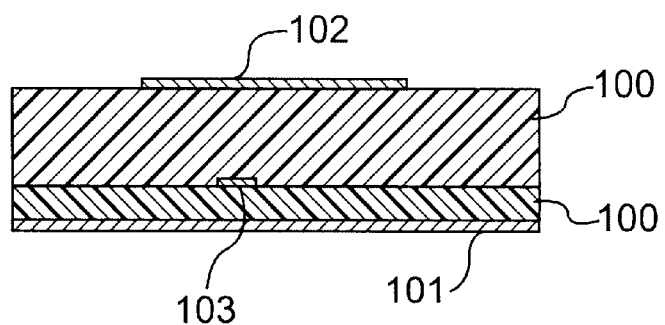
FIG. 14B is a cross sectional view through a plane at A—A in FIG. 14A.
Figure 15A:
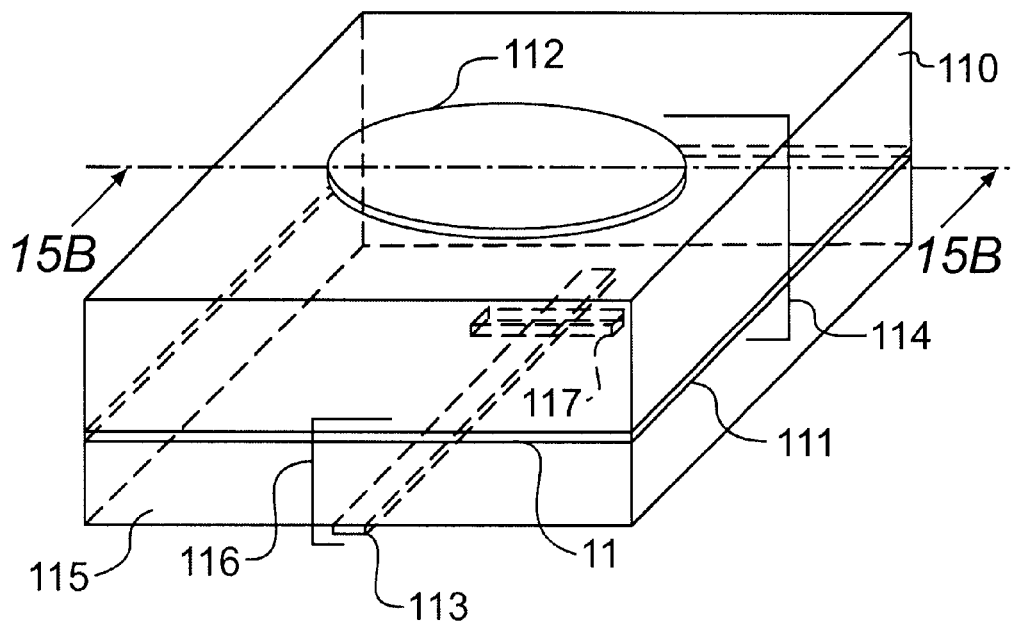
FIG. 15A is a perspective view of another conventional microstrip antenna.
Figure 15B:
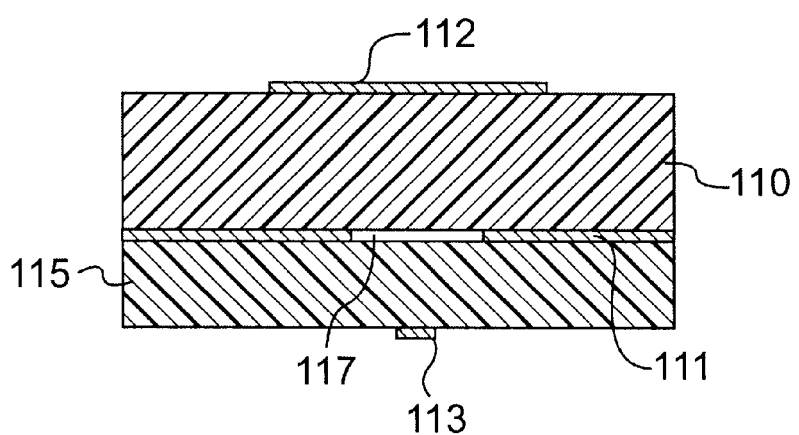
FIG. 15B is a cross sectional view through a plane at A—A in FIG. 15A.
Figure 16:
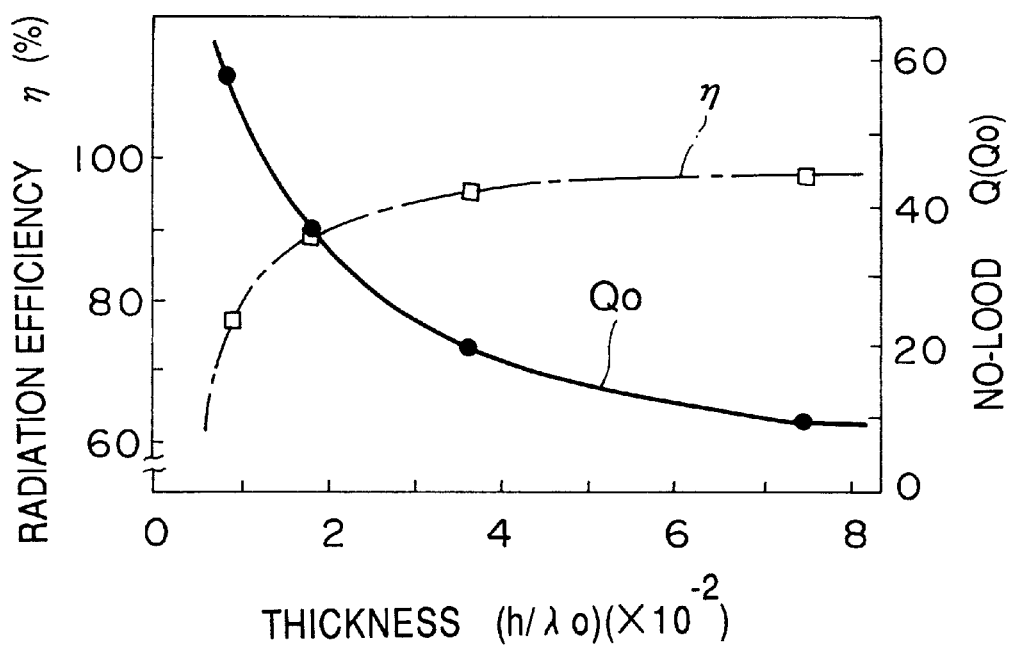
FIG. 16 is a graph of radiation efficiency and no-load Q for a conventional circular microstrip antenna.
Figure 17A:
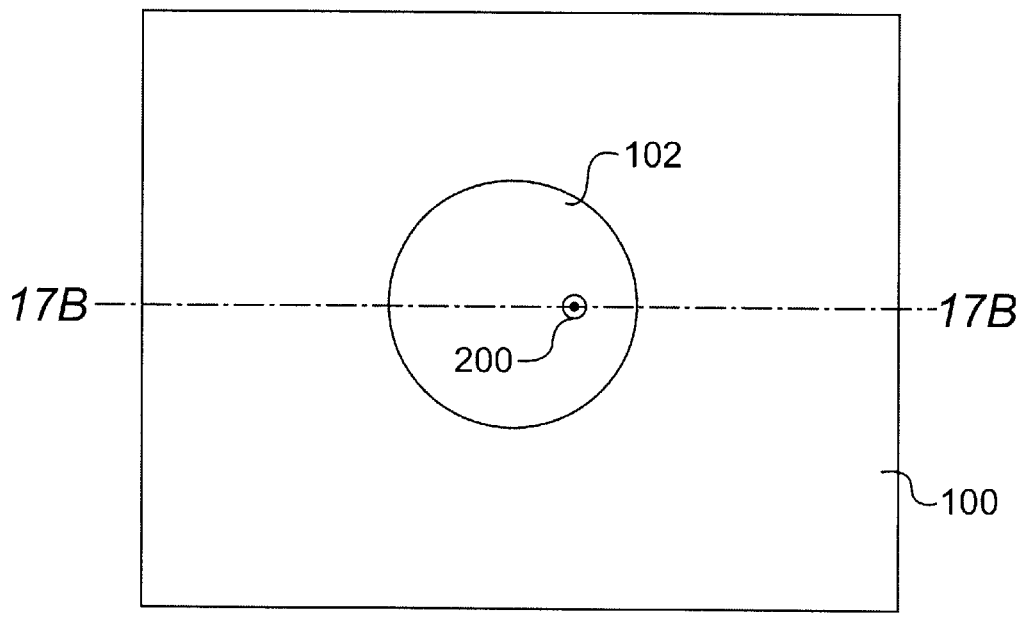
FIG. 17A is a plan view of a conventional dual-frequency microstrip antenna.
Figure 17B:
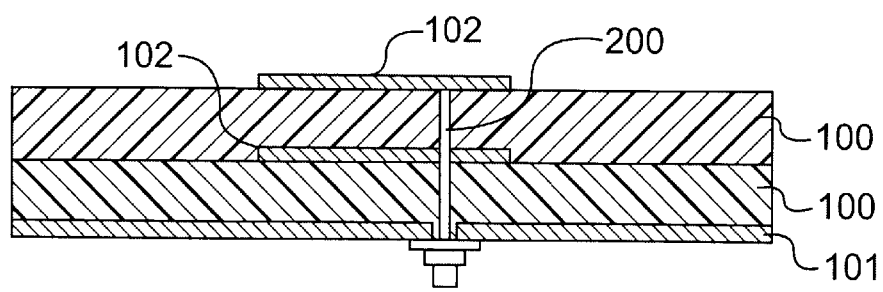
FIG. 17B is a cross sectional view through a plane at A—A in FIG. 17A.
Figure 18A:
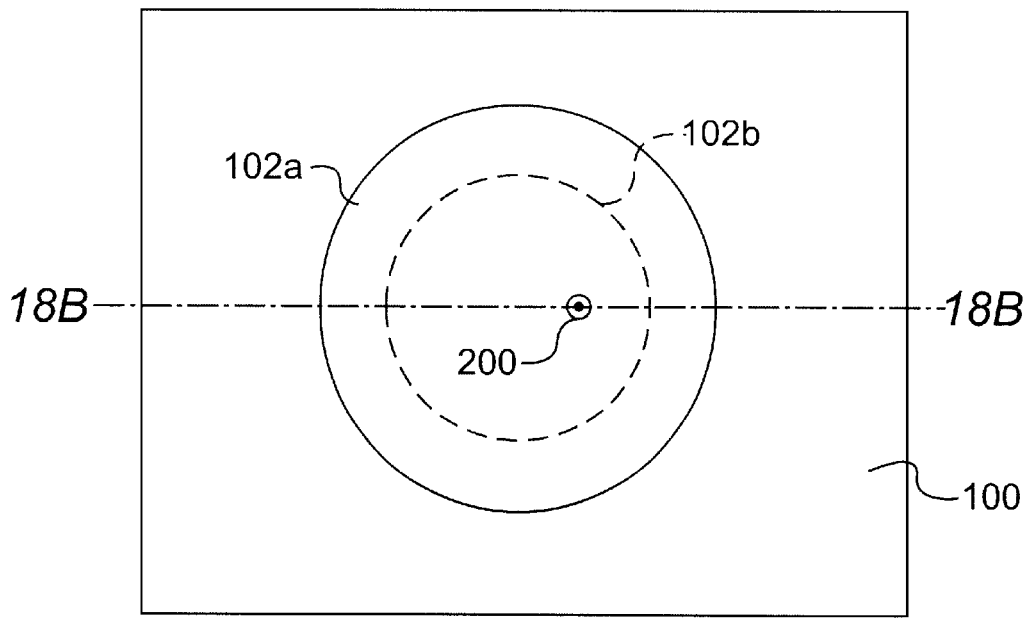
FIG. 18A is a plan view of another conventional dual-frequency microstrip antenna.
Figure 18B:
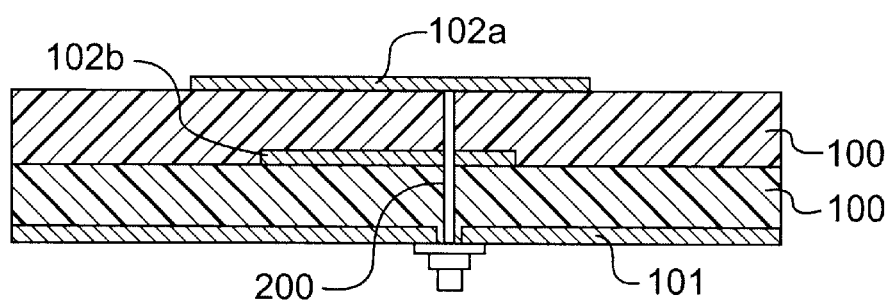
FIG. 18B is a cross sectional view through a plane at A—A in FIG. 18A.
Figure 19A:
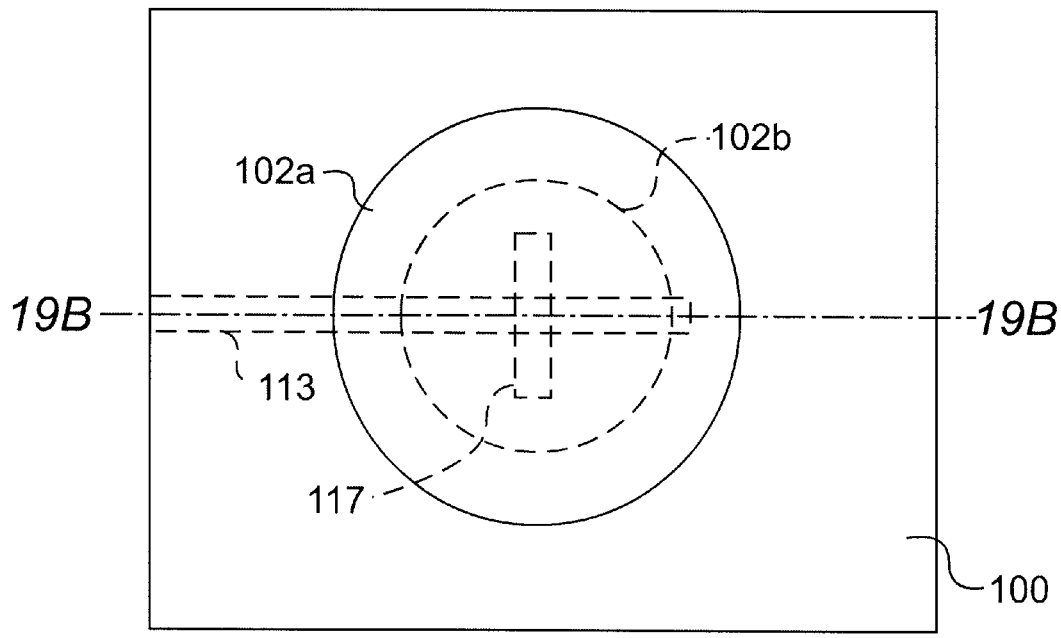
FIG. 19A is a plan view of another conventional dual-frequency microstrip antenna.
Figure 19B:
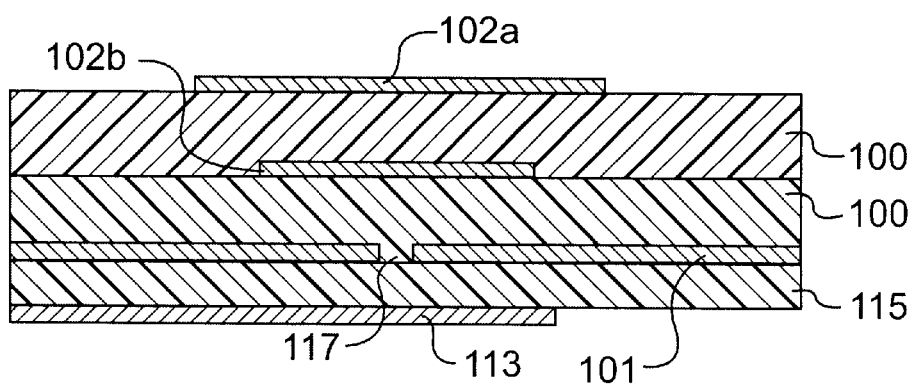
FIG. 19B is a cross sectional view through a plane at A—A in FIG. 19A.
Figure 20A:
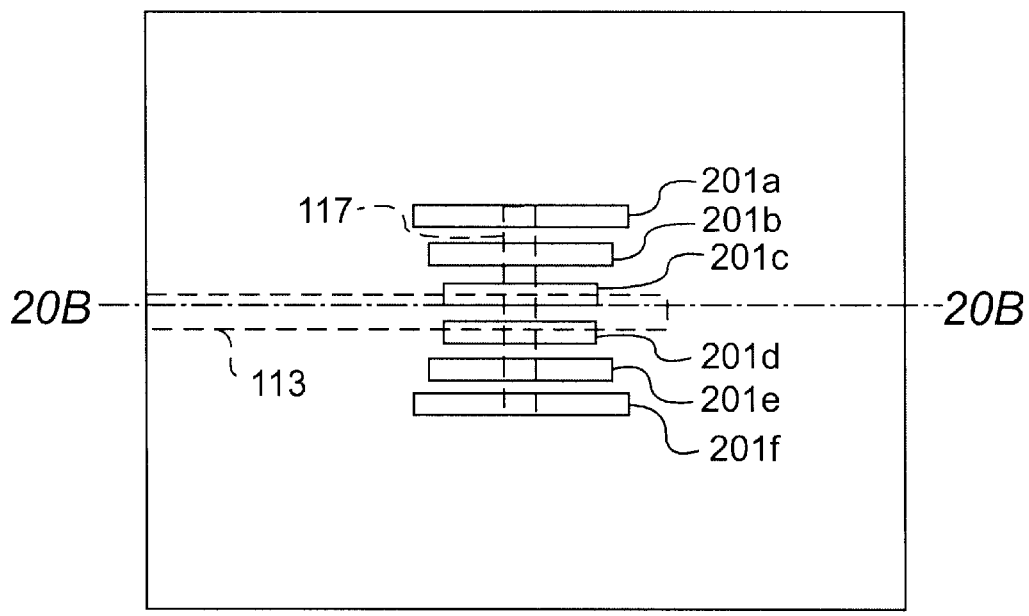
FIG. 20A is a plan view of a conventional microstrip antenna having a multi-band radiation element.
Figure 20B:
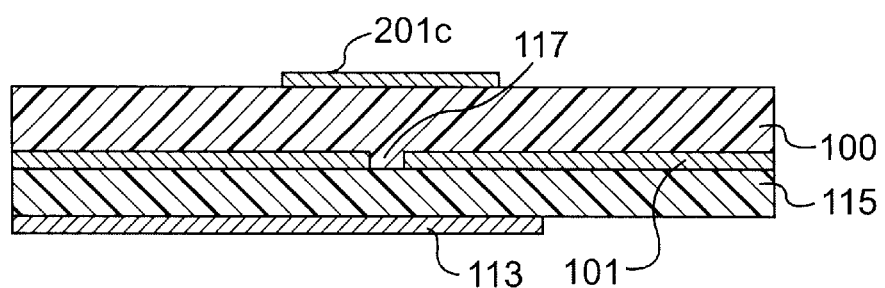
FIG. 20B is a cross sectional view through a plane at A—A in FIG. 20A.

FIG. 13A is a plan view of an antenna of embodiment 12, and FIG. 13B is a cross sectional view through a plane at A—A in FIG. 13A. The same reference numerals are retained, and their explanations are omitted.

The microstrip antenna of this embodiment is provided with lamination 1 comprising a plurality of first dielectric film members 1, lamination 2 comprising a plurality of second dielectric film members 2, and lamination 3 comprising a plurality of third dielectric film members 25. The microstrip antenna of this embodiment thus comprises a three kinds of dielectric laminations with lamination 1 common to laminations 2, 25. An radiation element 12 is provided in lamination 2, an radiation element 12a in lamination 3, a ground plane 11 and a strip conductor 13 are provided in lamination 1. This configuration produces a bi-directional multifrequency-band microstrip antenna which radiates signals upwards and downwards into the free spaces above and below the antenna shown in FIG. 13B, with a common ground plane 11 disposed in lamination 1.

In all of the foregoing embodiments, dielectric laminations comprise four film members, but the number of films is not particularly limited to such a number, and any number of desired films may be incorporated in a lamination. It is also permissible to use two radiation elements to produce a phase difference of 90 degrees between the signal terminals. It is also possible to provide a notched element to produce circularly polarized waves.

What is claimed is:

1. A multi-lamination microstrip antenna comprising:

a plurality of dielectric laminations comprising a plurality of stacked dielectric film members, each dielectric film member having a selected dielectric constant and a selected film thickness, wherein the selected dielectric constant and the selected film thickness are the same with regard to the dielectric film members in the same dielectric lamination, and different with regard to the dielectric film members in different dielectric laminations;

a radiation element in contact with a film surface of a first dielectric film member disposed in a first lamination; and a ground film member, which functions as a ground conductor of said radiation element, in contact with a film surface of a second dielectric film member disposed in a second lamination, wherein said ground film member forms a ground plane.

2. A microstrip antenna, as claimed in claim 1, comprising:

a high frequency signal line, disposed opposite to said radiation element with said ground plane intervening between said high frequency signal line and said radiation element, wherein said high frequency signal line is in contact with a film surface of a dielectric film member in a lamination; and a slot formed on said ground film member for receiving input signals into said radiation element so as to enable said input signals to couple with said radiation element in accordance with the electromagnetic field generated by said high frequency signal line to drive said radiation element.

3. A microstrip antenna, as claimed in claim 1, comprising:

a high frequency signal line, disposed opposite to said radiation element with said ground plane intervening between said high frequency signal line and said radiation element, wherein said high frequency signal line is in contact with a film surface of a dielectric film member in a lamination;

a slot formed on said ground film member; and a conductor member for operatively connecting an end of said high frequency signal line with said radiation element, so as to produce a direct electrical connection to drive said radiation element.

4. A microstrip antenna as claimed in claim 3, wherein said conductor member is an open ended cavity termed a via-hole.

5. A microstrip antenna as claimed in one of claims 1 to 4, wherein said high frequency signal line is a microstrip line.

6. A microstrip antenna as claimed in one of claims 1 to 4, wherein said high frequency signal line is a tri-plate line.

7. A microstrip antenna as claimed in one of claims 1 to 4, wherein a plurality of said radiation elements are provided.

8. A microstrip antenna as claimed in one of claims 1 to 4, wherein said antenna is provided with electronic circuit means for processing signals received by and transmitted from said radiation element, disposed in contact with a dielectric film member in a lamination.

9. A microstrip antenna as claimed in one of claims 1 to 4, wherein said antenna is provided with electronic circuit means for processing antenna signals, in operative contact with said ground film member.

10. A microstrip antenna as claimed in one of claims 1 to 4, wherein a cavity space is formed by removing at least one dielectric film member.

11. A microstrip antenna as claimed in one of claims 1 to 4, wherein circuit element means are provided at an interface between said dielectric film members.

12. A microstrip antenna as claimed in claim 11, wherein said circuit element means are capacitors.

13. A microstrip antenna as claimed in claim 11, wherein said circuit element means are resistors.

14. A microstrip antenna as claimed in one of claims 1 to 4, wherein said dielectric film members comprise alumina ceramic material.

15. A microstrip antenna as claimed in one of claims 1 to 4, wherein said dielectric film members comprise polyamide film.

* * * * *